United States Patent
Li et al.

(10) Patent No.: US 9,885,811 B2
(45) Date of Patent: Feb. 6, 2018

(54) PRISM FILM AND METHOD AND APPARATUS FOR MANUFACTURING THE SAME

(71) Applicant: Beijing BOE Optoelectronics Technology Co., Ltd., Beijing (CN)

(72) Inventors: Rui Li, Beijing (CN); Junguo Liu, Beijing (CN)

(73) Assignee: BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 352 days.

(21) Appl. No.: 13/972,142

(22) Filed: Aug. 21, 2013

(65) Prior Publication Data

US 2014/0055861 A1 Feb. 27, 2014

(30) Foreign Application Priority Data

Aug. 22, 2012 (CN) .......................... 2012 1 0301889

(51) Int. Cl.
*G02B 27/10* (2006.01)
*G02B 5/04* (2006.01)
(Continued)

(52) U.S. Cl.
CPC ........... *G02B 5/045* (2013.01); *G02B 3/0043* (2013.01); *G03B 27/72* (2013.01); *G03F 7/001* (2013.01); *G03F 7/70408* (2013.01)

(58) Field of Classification Search
CPC .............................. G02B 5/045; G02B 6/0053
(Continued)

(56) References Cited

U.S. PATENT DOCUMENTS 4,013,465 A 3/1977 Clapham et al.
6,258,443 B1 * 7/2001 Nilsen .................... G02B 5/124
359/529

(Continued)

FOREIGN PATENT DOCUMENTS

CN 1788231 A 6/2006
CN 101295047 A 10/2008
(Continued)

OTHER PUBLICATIONS

European Patent Office Communication and European Search Report, dated Nov. 7, 2013, 8 pages.
(Continued)

*Primary Examiner* — James Jones
(74) *Attorney, Agent, or Firm* — Ladas & Parry LLP

(57) ABSTRACT

Embodiments of the present invention provide a prism film and a method and an apparatus for manufacturing the prism film. The prism film comprises a substrate which is provided with prism protrusions formed of photoresist; wherein at least two prism protrusions have different heights. The embodiments of the present invention adopt the laser interference lithography apparatus for forming the prism film, such that the prism film has adjustable prism period and modulation depths. Moreover, the depth of modulation is distributed randomly on the surface of the manufactured prism film, and a prism direction and a prism period can be adjusted conveniently.

17 Claims, 5 Drawing Sheets

(51) Int. Cl.
*G02B 3/00* (2006.01)
*G03F 7/20* (2006.01)
*G03B 27/72* (2006.01)
*G03F 7/00* (2006.01)

(58) Field of Classification Search
USPC ....................................................... 359/625
See application file for complete search history.

(56) References Cited

U.S. PATENT DOCUMENTS

| | | | |
|---|---|---|---|
| 2003/0148401 A1* | 8/2003 | Agrawal | B01J 19/0046 506/9 |
| 2003/0156328 A1* | 8/2003 | Goto | G02B 6/0038 359/599 |
| 2004/0190102 A1 | 9/2004 | Mullen et al. | |
| 2005/0280752 A1 | 12/2005 | Kim et al. | |
| 2007/0097708 A1 | 5/2007 | Shim et al. | |
| 2008/0119583 A1* | 5/2008 | Jones | B82Y 30/00 522/113 |
| 2009/0059128 A1 | 3/2009 | Han et al. | |
| 2014/0118715 A1* | 5/2014 | Fu et al. | 355/71 |

FOREIGN PATENT DOCUMENTS

| | | |
|---|---|---|
| CN | 101566793 A | 10/2009 |
| CN | 102141736 A | 8/2011 |
| EP | 0271002 A2 | 6/1988 |
| GB | 2349237 A | 10/2000 |
| KR | 100935717 B1 | 1/2010 |

OTHER PUBLICATIONS

First Chinese Office Action dated May 5, 2015; Appln. No. 201210301889.8.

* cited by examiner

PRISM FILM AND METHOD AND APPARATUS FOR MANUFACTURING THE SAME

CROSS REFERENCE TO RELATED APPLICATIONS

This application claims priority from Chinese National Application No. 201210301889.8 filed on Aug. 22, 2012, the contents of which are incorporated herein by reference.

TECHNICAL FIELD

Embodiments of the present invention relate to a prism film and a method and an apparatus for manufacturing the same.

BACKGROUND

FIG. 1 illustrates a structure of a backlight in a LCD module. The backlight comprises a liquid crystal panel 1, a protective film 2, an upper prism film 3, a lower prism film 4, a diffusing film 5, a light guiding plate 6 and a bottom reflecting sheet 8 successively from top to bottom. The backlight further comprises a light source 9 located at least one side of the light guiding plate 6, a reflector 10 surrounding the light source 9 and open to the light guiding plate 6, and grids 7 disposed on the bottom surface of the light guiding plate 6. Wherein the protective film 2 may be unnecessary in some backlights. The structure of backlight can be in forms of any combination of the elements mentioned. The backlight is not limited to be applicable to a liquid crystal display device, but can be applicable to other display devices such as an electronic paper etc.

The upper prism film 3 as shown in FIG. 1 is mainly used for converging light. FIG. 2 shows a conventional technology for fabricating the upper prism film; firstly a photoresist is formed on a surface of a substrate which may be composed of macromolecule polymers, for instance, the substrate may be composed of one layer or multi-layers of macromolecule polymers. The macromolecule polymers may be PET (polyethylene terephthalate) etc. The photoresist can be formed on the surface of the substrate by coating, sputtering or depositing, and then passing the substrate through a rotary wheel 13 with prism teeth. The shape defined by adjacent prism teeth on the rotary wheel 13 corresponds to the shape of the prism to be formed, and these prism teeth can form a prism structure on the photoresist. And then the photoresist is cured by a curing light source, such that the substrate and the structures of prism thereon constitute a prism film. For instance, the photoresist may be an UV photoresist, and the curing light source may be an UV curing light source accordingly. It can also adopt photoresists of other types as well as the corresponding curing light sources.

However, the above technology for manufacturing prism film has the following disadvantages in practice: (1) the prism teeth of the rotary wheel are worn and deformed in use, so as to degrade the prism film; (2) when repairing the prism teeth or changing of the prism's parameters such as prism period, modulation depth etc., it needs to process the prism teeth with a machining method such as a laser processing method or a mechanical processing method. However, these processing methods are very complicated, as well as being high-cost and low time-efficient; (3) the modulation depth of the prism structure on the surface of prism film processed by the conventional technology is generally fixed, thereby it can not effectively avoid conglutination between the prism film and other films or the liquid crystal panel.

SUMMARY

In view of this, embodiments of the present invention provide a prism film and a method and an apparatus for manufacturing the prism film, thereby obtaining a prism film with different modulation depths.

In order for convenience of statement, the terms are defined as follows:

"Prism protrusion" means a protrusion formed by the photoresist and defining the prism structure on the surface of the substrate;

"Prism period" means a distance between two adjacent prism protrusions, it may be a distance between either the adjacent highest points or the lowest points of prism protrusions, but in this description it means a distance between the adjacent highest points of prism protrusions;

"Modulation depth" means a protruding height of prism, and in this description it means a distance between a protruding highest point of prism and the substrate; and "Prism direction" means a direction along which the prism protrusion extends on the substrate.

The embodiments of present invention provide a prism film comprising a substrate, and a plurality of prism protrusions of photoresist disposed on the substrate; and modulation depths of at least two prism protrusions are different.

The prism protrusions on the prism film provided by the embodiments of present invention are formed by interfering photoresist with laser beams; wherein the prism period is determined by the interference angle between the laser beams incident on the photoresist and the wavelength of the laser beam.

The modulation depth is determined by the time of exposing the photoresist by laser and/or the time of developing the photoresist.

A method for manufacturing a prism film comprises: coating a photoresist on a surface of a substrate; performing laser interference lithography on the photoresist; developing and fixing the photoresist processed by the laser interference lithography, and forming prism protrusions with different modulation depths on the surface of the substrate so as to obtain a fixed prism film; and performing dry-molding processing on the fixed prism film so as to obtain a final prism film.

The laser interference lithography on the photoresist comprises the following steps: pre-heating and placing the substrate coated with the photoresist on a lithography platform; outputting a UV laser beam by a solid laser, expanding, collimating and splitting the UV laser beam to obtain two UV laser beams, and then expanding the two UV laser beams once again and converging them on a surface of the substrate coated with the photoresist at an interference angle θ for the interference lithography.

The above method further comprises the following steps: rotating the substrate coated with the photoresist in a plane perpendicular to the UV laser beams, and forming prism protrusions with different prism directions on the surface of the substrate; adjusting the prism period by changing the interference angle θ and/or the wavelength of the laser beams.

The prism period can be adjusted by changing the interference angle θ on the basis of the formula: $d=n\lambda/(2\sin(\theta/2))$, in which the d is a prism period, n is a reflective index of a laser beam in a propagation medium, λ is a wavelength of the laser beam, and θ is an interference angle between the laser beams.

The embodiments of present invention also provide an interference lithography apparatus for manufacturing a prism film. The interference lithography apparatus comprises a solid laser, as well as a beam expanding unit, a collimating unit, a light splitting unit and a light converging unit; wherein, the beam expanding unit is used for expanding UV laser emitted from the solid laser, the collimating unit is used for collimating the expanded UV laser so as to obtain the collimated UV laser; the light splitting unit is used for splitting the collimated UV laser so as to obtain two collimated UV laser beams with a constant phase difference; the light converging unit is used for, on the surface of the substrate coated with the photoresist, converging the two collimated UV laser beams obtained by the splitting unit for the interference lithography.

For example, the beam expanding unit may be a beam expanding convex lens; the collimating unit may be a collimating convex lens; and the focus of the beam expanding convex lens coincides with the focus of the collimating convex lens.

Furthermore, the interference lithography apparatus also comprises: a reflecting unit for reflecting the collimated UV laser obtained by the collimating unit to the light splitting unit.

In the condition that the reflecting unit is a silver-plated reflector, an included angle in a range of 10° to 170° is formed between a center axis direction of the reflecting unit and an incident direction of the collimated UV laser beam emitted from the collimating unit; the center axis direction of the reflecting unit means a normal direction perpendicular to the reflecting surface of the reflecting unit.

An included angle of 45° is formed between the center axis direction of the reflecting unit and an incident direction of the collimated UV laser emitted from the collimating unit.

The light converging unit comprises a first reflecting subunit, a second reflecting subunit, a first beam expanding subunit and a second beam expanding subunit. And the light splitting unit is used for reflecting one half of the collimated UV laser beam to the first reflecting subunit, and transmitting the remaining half of the collimated UV laser beam to the second reflecting subunit.

The first reflecting subunit is used for reflecting the incident collimated UV laser to the first beam expanding subunit; the second reflecting subunit is used for reflecting the incident collimated UV laser beam to the second beam expanding subunit; the first and second beam expanding subunits are used for expanding the incident collimated UV laser beams, and then converging the expanded UV laser beams on the surface of the substrate coated with the photoresist at an interference angle θ for the interference lithography.

In the condition that the first and second reflecting subunits are reflectors, the first and second reflecting subunits are arranged symmetrically by taking the reflecting surface of the light splitting unit as a symmetry plane.

In the condition that the first and second beam expanding subunits are beam expanding convex lenses, the positions of the first and second beam expanding subunits are determined on the basis of focal lengths thereof and sizes of the interference light spots formed on the surface of the substrate coated with the photoresist.

The interference lithography apparatus further comprises a lithography platform, which can rotate in a plane perpendicular to an incident direction of laser beams, and move parallelly with respect to the light converging unit. The substrate coated with the photoresist can rotate in a plane perpendicular to the UV laser by means of rotation of the lithography platform, and the prism protrusions with different prism directions are finally formed on the surface of the substrate after the exposing, developing and fixing steps. The sizes of the interference light spots on the surface of the substrate coated with the photoresist can be adjusted through the moving of the lithography platform with respect to the light converging unit.

The first and second reflecting subunits can move with respect to the reflecting surface of the light splitting unit, so as to adjust the sizes of interference light spots.

The first and second reflecting subunits can rotate with respect to the reflecting surface of the light splitting unit, so as to adjust the interference angle between the laser beams.

The first and second beam expanding subunits can move with respect to the first and second reflecting subunits, respectively, so as to adjust the sizes of interference light spots of the laser beams.

The first and second beam expanding subunits can rotate with respect to the first and second reflecting subunits, respectively, so as to adjust the interference angle θ.

The embodiments of present invention manufacture a prism film by interference lithography with the advantages of high productivity and low cost. Since the modulation depth of prisms on the surface of the prism film is distributed randomly, it can effectively solve the problem of conglutination between the prism film and other films or liquid crystal panel. And moreover, since the direction and cycle of prism can be easily adjusted, it can effectively solve the problem of image display such as Morie fringe etc.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make the purpose, technical solution and advantages of the present invention more clear, the technical solution of the present invention shall be a clearly and fully understandable way in connection with the drawings related to the embodiments of the present invention. It is obvious that the described embodiments are just a part but not all of the embodiments of the invention. Based on the described embodiments herein, those skilled in the art can obtain other embodiments, without any inventive work, which should be within the scope of the invention.

The principle idea contained in the disclosure of the present invention is: a method for manufacturing a prism film includes: coating a surface of a substrate with photoresist; performing the laser interference lithography on the photoresist; developing and fixing the photoresist processed by the laser interference lithography, forming prism protrusions with different modulation depths on the surface of the substrate, and obtaining a fixed prism film; performing dry-molding processing to the fixed prism film so as to obtain a final prism film. The prism film with modulation depth changed randomly can effectively prevent conglutination of films.

Figure 1:
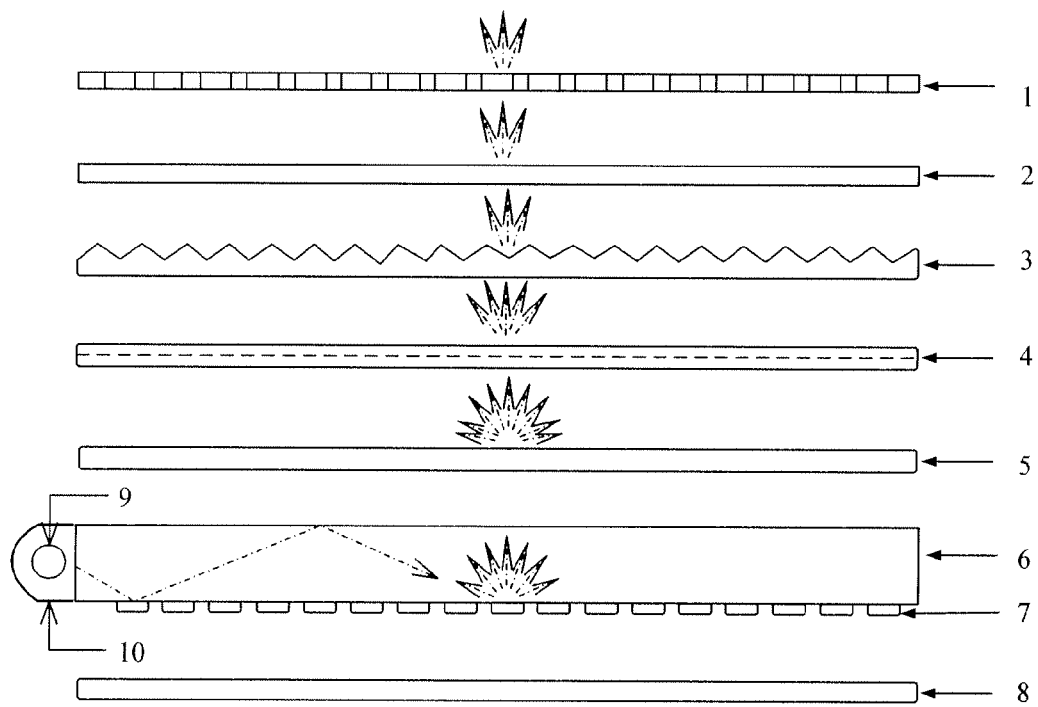
FIG. 1 illustrates a structural schematic diagram of the backlight in the liquid crystal display device.
Figure 2:
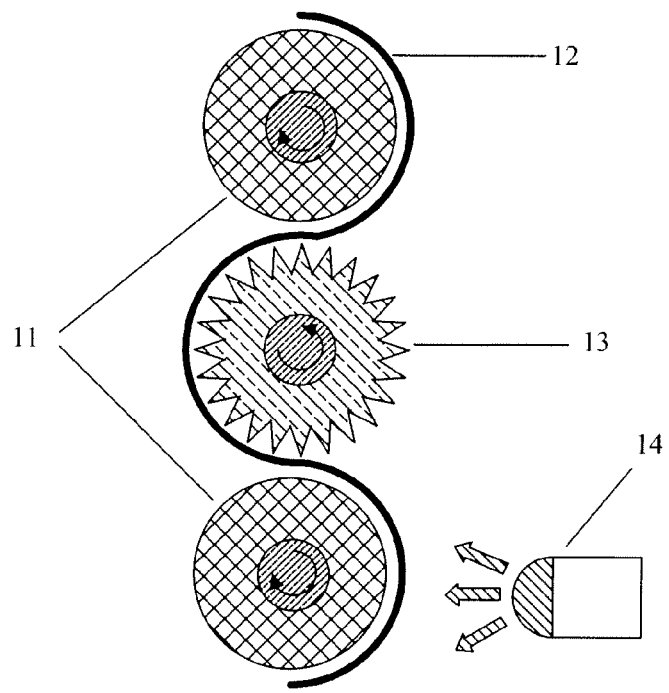
FIG. 2 illustrates the process for manufacturing a prism film.
Figure 3:
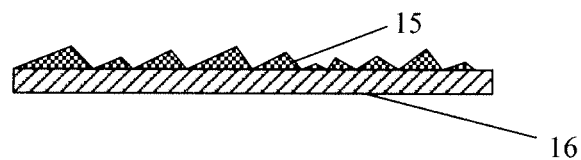
FIG. 3 illustrates a structural schematic diagram of the prism film according to one embodiment of the present invention.

FIG. 3 shows that the prism film in accordance with one embodiment of the present invention comprises a substrate 16, and a plurality of prism protrusions 15 formed of photoresist on the substrate 16; at least two prism protrusions 15 have different heights.

Furthermore, the prism protrusions 15 are formed by interference of laser beams on the photoresist; the prism period d is determined by the interference angle θ between the incident laser beams on the photoresist for interference and/or the wavelength of the laser beam; the modulation depth $M_d$ of the prism protrusions 15 is determined by the time of exposing the photoresist to laser beams and/or the time of developing the photoresist. It is understood by those skilled in the art that the prism protrusions 15 may have various shapes, for instance, a spike protrusion or a circle protrusion etc.

The method for manufacturing a prism film in accordance with one embodiment of the present invention shall be explained herein. The method comprises the steps as follows.

In the step 401, the substrate is coated with photoresist.

Figure 4:
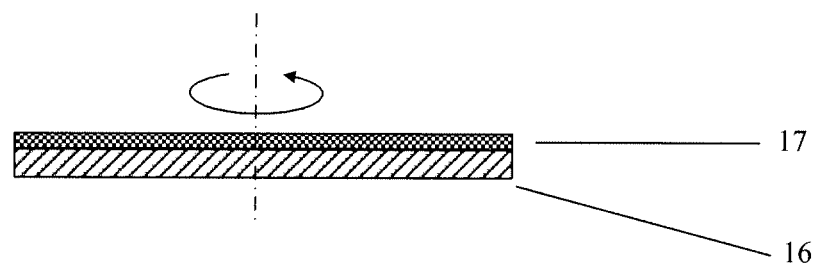
FIG. 4 illustrates a schematic diagram of coating a substrate with photoresist in one embodiment of the present invention.

With reference to FIG. 4, for example, PET is used for making a substrate 16, and the substrate 16 is coated with the photoresist 17 such as photoresist SU8, and the substrate 16 is coated with the photoresist 17 uniformly by adjusting the rotating speed and the rotating time of a spin coater. The thickness of the photoresist can be adjusted by adjusting the rotating speed of the spin coater.

The photoresist SU8 is a transparent epoxy resin; it has a small molecular weight and is a chain structure macromolecule before subject to irradiation of light; when subject to irradiation of UV rays, a polymerization occurs to SU8 and a latticed macromolecule is produced. The epoxy resin has a good chemical stability and high rigidity, and is a positive photoresist. It can be understood that the substrate can also be coated with other transparent photoresists with high optical transmissivity such as an UV photoresist etc.

In the step 402, a laser interference lithography is performed on the photoresist.

Firstly, a pre-heated substrate coated with the photoresist is placed on a lithography platform; a UV laser beam is output by a solid laser, and then expanding, collimating and splitting the UV laser beam so as to obtain two UV laser beams, and subsequently, expanding the two UV laser beams once again, and converging them on the surface of the photoresist with an interference angle θ for the interference lithography. The prism period can be adjusted on the basis of the formula $d=n\lambda/(2 \sin(\theta/2))$, in which the d is a prism period, n is a reflective index of a medium in which the laser beam propagates, λ is a wavelength of the laser beam, and θ is an interference angle. It can be seen from the formula that the prism period can be adjusted by changing the interference angle θ and/or the wavelength λ of the laser beam.

Figure 5:
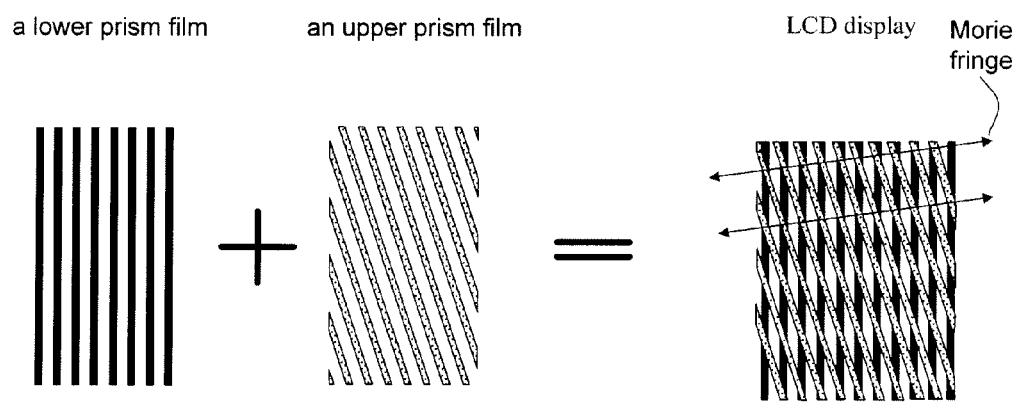
FIG. 5 illustrates a schematic diagram of Morie fringe formed by unmatched prism directions of the upper and lower prism films.
Figure 6:
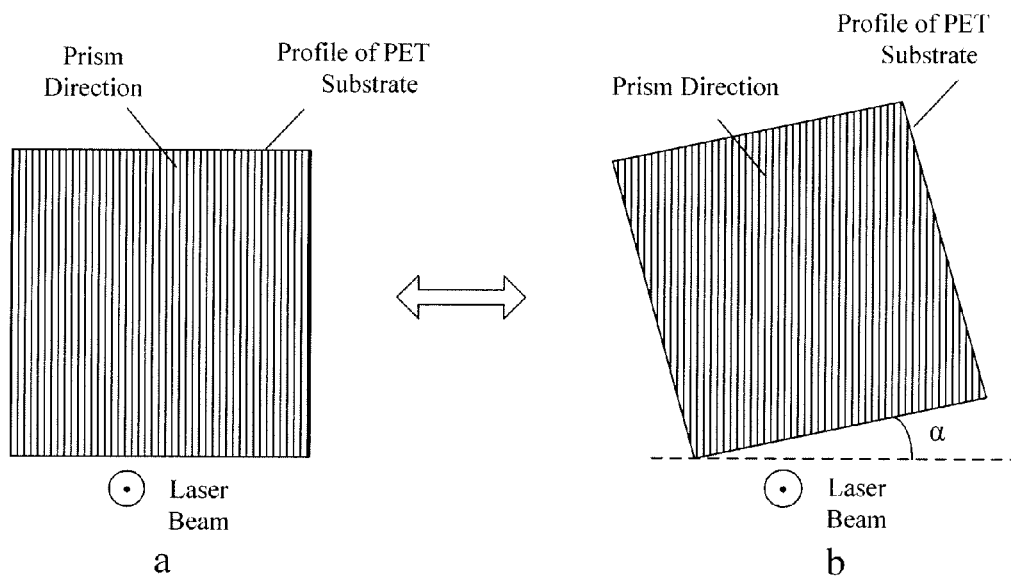
FIGS. 6a and 6b are schematic diagrams of the prism directions obtained before and after rotation of the substrate in one embodiment of the present invention.

The substrate coated with the photoresist can be rotated in a plane perpendicular to the UV laser, so as to form prism protrusions with different prism directions; thereby undesirable phenomenon, such as Morie fringe etc. produced in the process of developing film material of backlight, can be conveniently removed. It is noted over here that the produced Morie fringe is due to unmatched prism directions of the upper and lower prism films in the backlight, such that the fringes in periodical arrangement are formed in the display image. As shown in FIG. 5, the undesirable Morie fringes can be removed through adjusting arranging angle of the prisms in the prism film, such that the prism directions of the upper and lower prism films are perpendicular to each other in theory, in this case, it can avoid the occurrence of Morie fringe in the display image. However, in case of changing the prism directions in the conventional technology, it needs to engrave the arranging directions of prism teeth on the rotary wheel once again so as to change the prism directions; that is, it is equivalent to make a new mould, thereby involving a long period of developing technology, a high cost and a complex procedures. But, in the method provided in the embodiments of the present invention, as shown in FIG. 6, the substrate is rotated by angle α on a plane perpendicular to a plane in which the interference laser beams are located, and then the prism direction produced by the laser interference changes with respect to the edge of the substrate. As shown in FIG. 6a, before rotating the substrate coated with the photoresist, the prism direction is perpendicular to the bottom margin of the substrate; after rotating the substrate at angle α on a plane perpendicular to a plane on which the interference laser beams are located, the prism direction is perpendicular to the horizontal line, but having an included angle of 90-α degree with the bottom margin of the substrate (please refer to FIG. 6b for the details).

In the step 403, the substrate processed by the laser interference lithography is developed and fixed to form the prism protrusions with different modulation depths on the surface of photoresist on the substrate, and then a fixed prism film is obtained. For instance, the substrate coated with the photoresist processed by the laser interference lithography is developed and fixed, such that a plurality of microprism structures, i.e. a plurality of prism protrusions, with different modulation depths are formed on the surface of the substrate. For instance, the prism protrusions may be spike protrusions or circle protrusions etc.

And moreover, the modulation depths on the surface of the prism film can be controlled by adjusting the time of the laser interference lithography for the photoresist on the substrate, i.e. adjusting the time of exposing the photoresist and/or the time of developing the photoresist. It can be understood that the modulation depths of the parims on the surface of the prism film can also be controlled by adjusting the intensity of the laser.

For instance, in the event that exposing for 5 seconds and developing for 8 seconds, the obtained modulation depth of the prism is 250 um; when exposing for 3 seconds and developing for seconds, the obtained modulation depth of the prism is 160 um. A better modulation depth can be obtained by optimizing the time parameters during developing a prism film. Prisms with different modulation depths can also be obtained by adopting the same exposing time and different developing times.

In the step 404, the dry-molding processing is performed on the fixed prism film, so as to obtain a final prism film. In this step, other types of dry-shaping technology can be adopted.

Furthermore, a heating technology can also be adopted for speeding up curing the photoresist and improving the rigidity of the photoresist.

Figure 7:
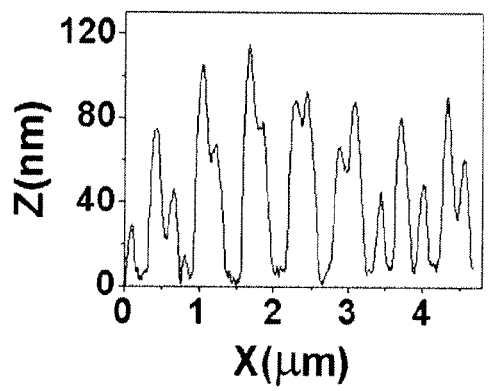
FIG. 7 is a graph showing the modulation depth of a prism film made by the method in accordance with one embodiment of the present invention and observed under an atomic force microscope.

FIG. 7 shows the modulation depth on the surface of the final prism film observed under an atomic force microscope (AFM), wherein the abscissa axis denotes a length direction of the prism film, i.e. a direction perpendicular to the direction of prism, and the ordinate axis denotes the modulation depth. As shown in FIG. 7, the modulation depth on the surface of the prism film is distributed randomly.

Figure 8:
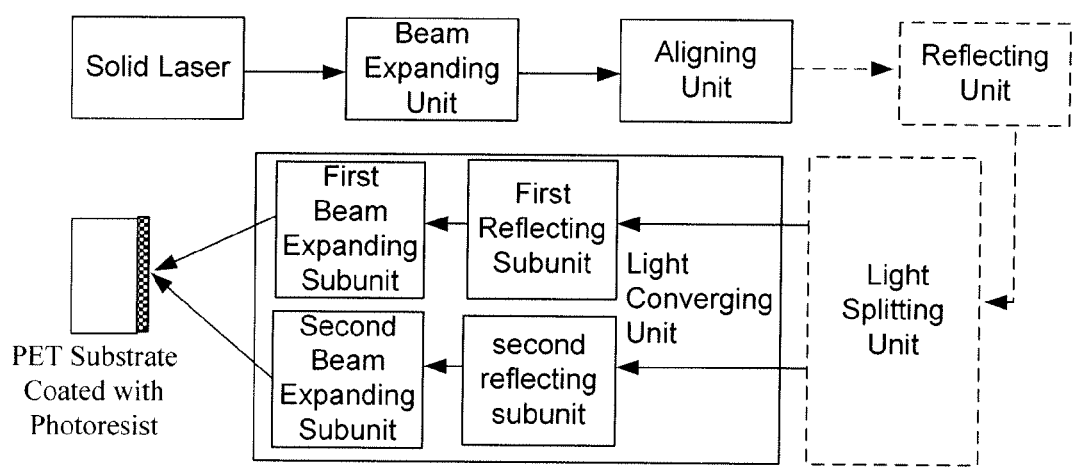
FIG. 8 illustrates a structural schematic diagram of an interference lithography apparatus for the prism film in one embodiment of the present invention.

FIG. 8 illustrates the structure of the interference lithography apparatus for manufacturing the prism film in accordance with embodiments of the present invention. As shown in FIG. 8, the interference lithography apparatus comprises a solid laser, a beam expanding unit, a collimating unit, a light splitting unit and a light converging unit; wherein, the beam expanding unit is used for expanding a UV laser beam emitted from the solid laser, the collimating unit is used for collimating the expanded UV laser beam so as to obtain the collimated UV laser beam; the light splitting unit is used for splitting the collimated UV laser beam so as to obtain two collimated UV laser beams with a constant phase difference; the light converging unit is used for converging the two collimated UV laser beams obtained by the splitting unit on the surface of the substrate coated with the photoresist for the interference lithography.

For example, the beam expanding unit may be a beam expanding convex lens; the collimating unit may be a collimating convex lens; and the focus of the beam expanding convex lens coincides with the focus of the collimating convex lens.

Furthermore, the interference lithography apparatus also comprises a reflecting unit for reflecting the collimated UV laser obtained by the collimating unit to the light splitting unit.

In the event that the reflecting unit is a silver-plated reflector, an included angle in a range of 10° to 170° is formed between a center axis direction of the reflecting unit and an incident direction of the collimated UV laser obtained by the collimating unit. For instance, an included angle of 45° is formed between the center axis direction of the reflecting unit and an incident direction of the collimated UV laser obtained by the collimating unit.

Furthermore, the light converging unit may comprise a first reflecting subunit, a second reflecting subunit, a first beam expanding subunit and a second beam expanding subunit.

The light splitting unit is used for reflecting one half of the collimated UV laser beam to the first reflecting subunit, and transmitting the remaining half of the collimated UV laser beam to the second reflecting subunit.

The first reflecting subunit is used for reflecting the incident collimated UV laser beam to the first beam expanding subunit; the second reflecting subunit is used for reflecting the incident collimated UV laser beam to the second beam expanding subunit; the first and second beam expanding subunits are used for expanding the incident collimated UV laser beam, and then converging the expanded UV laser beams on the surface of the substrate coated with the photoresist at an interference angle $\theta$ for the interference lithography.

In the event that the first and second reflecting subunits are reflectors respectively, the first and second reflecting subunits are arranged symmetrically by taking a reflecting surface of the light splitting unit as the symmetrical plane.

In the event that when the first and second beam expanding subunits are beam expanding convex lenses respectively, the positions of the first and second beam expanding subunits are determined according to focal lengths thereof and sizes of the interference light spots formed on the surface of the substrate coated with the photoresist.

Figure 9:
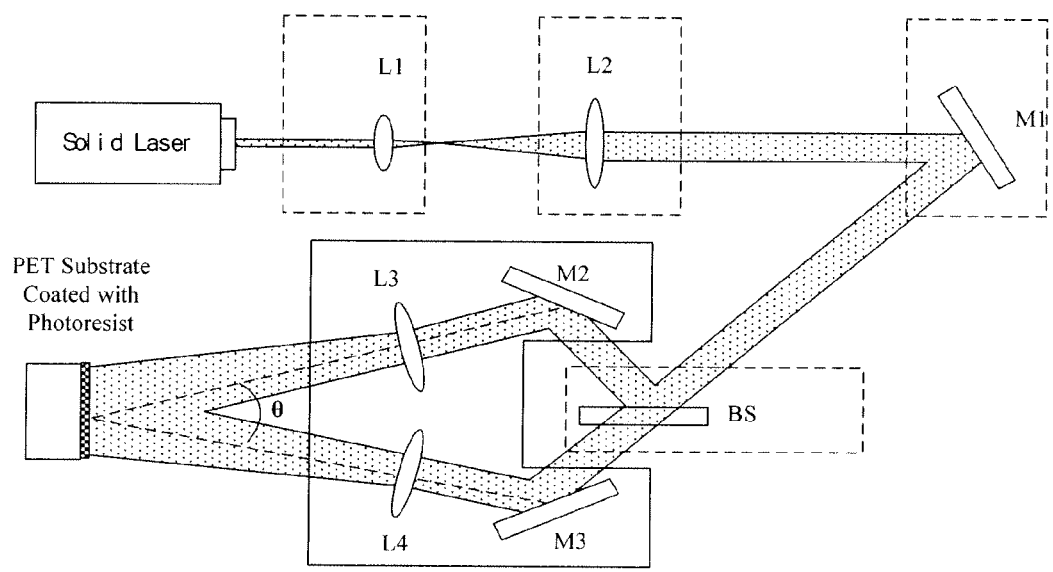
FIG. 9 illustrates a structural schematic diagram of an interference lithography apparatus for the prism film in one specific embodiment of the present invention.

FIG. 9 illustrates the structural schematic diagram of an interference lithography apparatus for manufacturing a prism film in accordance with one specific embodiment of the present invention. As shown in FIG. 9, the interference lithography apparatus comprises a solid laser, a beam expanding unit, a collimating unit, a reflecting unit, a light splitting unit and a light converging unit. For instance, the beam expanding unit is a convex lens L1, the collimating unit is a convex lens L2, the reflecting unit is a silver-plated reflector M1, the light splitting unit is a transflective convex lens BS, the first reflecting subunit is a reflector M2, the first beam expanding subunit is a convex lens L3, the second reflecting subunit is a reflector M3, and the second beam expanding subunit is a convex lens L4.

For instance, the focus of the beam expanding unit L1 coincides with the focus of the collimating unit L2, and the focus of the beam expanding unit L1 is smaller than the focus of the collimating unit L2. Generally, all the optical devices are placed perpendicular to the surface of the tabletop. An included angle in a range of 10° to 170° is formed between the center axis direction of the reflecting unit M1 and the incident light direction. In the event that an included angle of 45° is formed between the center axis direction of the reflecting unit M1 and the incident light direction, the whole interference lithography apparatus occupies a minimal area, wherein the distance between the reflecting unit M1 and the collimating unit L2 can be set flexibly according to the actual situation, for example, 5 cm etc. The included angle between the light splitting unit and the incident light direction can be adjusted based on the interference angle $\theta$ and the distance between the first and second reflecting subunits M2, M3 and the substrate coated with the photoresist. The first and second reflecting subunits M2 and M3 are arranged symmetrically by taking a reflecting surface of the light splitting unit as a symmetrical plane, so as to ensure the interference light beams irradiating the substrate coated with the photoresist symmetrically with respect to the reflecting surface of the light splitting unit. The positions of the beam expanding L1, the collimating unit L2, the first beam expanding subunit L3 and the second beam expanding subunit L4 can be adjusted according to the focal lengths of the selected convex lenses and the sizes of the interference light spots to be formed on the photoresist.

In the above embodiment, the first reflecting subunit M2 and the second reflecting subunit M3 can move with respect to the reflecting surface of the light splitting unit in a manner of mirror image, that is to say, if the first reflecting subunit M2 get closer to the light splitting unit, the second reflecting subunit M3 also get closer to the light splitting unit, and vice versa, so as to adjust the sizes of interference light spots. The first reflecting subunit M2 and the second reflecting subunit M3 can rotate with respect to the each other's mirror image of the reflecting surface of the light splitting unit, so as to adjust the size of the interference angle θ.

In the above embodiment, the first beam expanding subunit L3 and the second beam expanding subunit L4 can move with respect to the first reflecting subunit M2 and the second reflecting subunit M3 respectively, so as to adjust the sizes of the interference light spots. In addition, the first beam expanding subunit L3 and the second beam expanding subunit L4 can rotate with respect to the first reflecting subunit M2 and the second reflecting subunit M3 respectively, so as to adjust the size of the interference angle θ.

In the above embodiment, the interference lithography apparatus further comprises a lithography platform, which can rotate, and can move with respect to the light converging unit. The prism direction can be adjusted by the rotation of the lithography platform; and the sizes of the interference light spots irradiated on the substrate coated with the photoresist can also be adjusted through the moving of the lithography platform with respect to the light converging unit.

In the above embodiment, the solid laser emits an UV laser beam with a wavelength of 355 nm, in this case, for example, the light splitting unit can be a transflective beam splitter which can split the UV laser beam with a wavelength of 355 nm into two. The operating principle of the laser interference lithography apparatus is: Nd:YAG solid laser outputs an UV laser beam with a wavelength of 355 nm; after the UV laser beam is expanded by the beam expanding unit L1, collimated by the collimating unit L2, and splitted by the light splitting unit BS, the two light beams obtained are converged by the light converging unit on the surface of the photoresist on the substrate for the interference lithography.

Since the wavelength of the laser output by the solid laser is adjustable, the wavelength of the laser beam output by the solid laser can be adjusted according to the above formula in order to obtain the desired prism period d.

The first beam expanding subunit L3 and the second beam expanding subunit L4 are used for expanding the light beams reflected by the first reflecting subunit M2 and the second reflecting subunit M3 respectively, so as to form larger interference light spots on the surface of the photoresist on the substrate to be processed, thereby reducing the length of light path. The light beams reflected by the first reflecting subunit M2 and the second reflecting subunit M3 are converged on the surface of the photoresist on the substrate at an included angle θ, so as to form alternate dark and bright grating fringes, wherein the grating fringe of 0 grade at the central position of the long edge of the substrate coated with the photoresist has the strongest brightness, and the intensity of light is successively and symmetrically reduced towards both sides; after the developing and fixing, it may form prism protrusions, i.e. prism structure, with modulation depths distributed randomly on the surface of the substrate due to uneven coated photoresist and structural characteristics of the photoresist. The period of the prism protrusions is determined according to the formula as below: d=nλ/(2 sin(θ/2)), wherein, d is the prism period (prism pitch, i.e. a distance between peaks of two adjacent prism protrusions), n is a reflective index of the medium in which the UV laser beam propagates, λ is the wavelength of the laser beam, and θ is an interference angle. For instance, in the event that the laser beam has a wavelength of 355 nm, when the interference angle θ=10°, d=2.13 μm; and when the interference angle θ=15°, d=1.36 μm.

The foregoing are merely exemplary embodiments of the invention, but are not used to limit the protection scope of the invention. The protection scope of the invention shall be defined by the attached claims.

The invention claimed is:

1. A method for manufacturing a prism film by using an interference lithography apparatus for manufacturing a prism film comprising a substrate, wherein the substrate is provided with a plurality of prism protrusions formed of photoresist; at least two prism protrusions have different modulation depths, the modulation depth of each prism protrusion being a constant protruding height of the prism protrusion, each prism protrusion extending in a substantially straight line, the apparatus comprising:
   a solid laser,
   a beam expanding unit for expanding UV laser beam emitted from the solid laser;
   a collimating unit for collimating the UV laser beam expanded so as to obtain a collimated UV laser beam;
   a light splitting unit for splitting the collimated UV laser beam so as to obtain two collimated UV laser beams with a constant phase difference; and
   a light converging unit for converging the two collimated UV laser beams obtained by the splitting unit on the surface of the substrate coated with the photoresist for the interference lithography,
the method comprises following steps:
   coating a photoresist on a surface of a substrate;
   performing a laser interference lithography on the substrate coated with the photoresist by using the interference lithography apparatus;
   developing and fixing the photoresist processed by the laser interference lithography, and forming prism protrusions with different modulation depths on the surface of the substrate so as to obtain a fixed prism film; and
   performing drying process to the fixed prism film so as to obtain a final prism film.

2. The method according to claim 1, wherein, performing laser interference lithography on the substrate coated with the photoresist comprises following steps:
   pre-heating and placing the substrate coated with the photoresist on a lithography platform; and
   outputting a UV laser beam by a solid laser, expanding, collimating and splitting the UV laser beam to obtain two UV laser beams, and expanding the two UV laser beams to converge them on a surface of the photoresist at an interference angle (θ) for the interference lithography.

3. The method according to claim 2, wherein, the method further comprises:
   rotating the substrate coated with the photoresist in a plane perpendicular to the incident UV laser beams, so as to form prism protrusions with different prism directions; and
   adjusting a prism period of the prism film by changing the interference angle (θ) and/or a wavelength (λ) of the laser beam.

4. The method according to claim 3, wherein, the prism period is adjusted by changing the interference angle (θ) on the basis of the formula: d=nλ/(2 sin(θ/2)), in which d is the prism period, n is a reflective index of a medium in which the laser beam propagates, λ is the wavelength of the laser beam.

5. An interference lithography apparatus for manufacturing a prism film comprising a substrate, wherein the substrate is provided with a plurality of prism protrusions formed of photoresist; at least two prism protrusions have different modulation depths, the modulation depth of each prism protrusion being a constant protruding height of the prism protrusion, each prism protrusion extending in a substantially straight line, the apparatus comprising:
- a solid laser,
- a beam expanding unit for expanding UV laser beam emitted from the solid laser;
- a collimating unit for collimating the UV laser beam expanded so as to obtain a collimated UV laser beam;
- a light splitting unit for splitting the collimated UV laser beam so as to obtain two collimated UV laser beams with a constant phase difference; and
- a light converging unit for converging the two collimated UV laser beams obtained by the splitting unit on the surface of the substrate coated with the photoresist for the interference lithography.

6. The interference lithography apparatus according to claim 5, wherein,
- the beam expanding unit is a beam expanding convex lens;
- the collimating unit is a collimating convex lens; and
- the focus of the beam expanding unit coincides with the focus of the collimating unit.

7. The interference lithography apparatus according to claim 5, wherein, the interference lithography apparatus further comprises a reflecting unit for reflecting the collimated UV laser emitted from the collimating unit to the light splitting unit.

8. The interference lithography apparatus according to claim 7, wherein, the reflecting unit is a reflector, an included angle of 10° to 170° is formed between a center axis direction of the reflecting unit and an incident direction of the collimated UV laser beam emitted from the collimating unit.

9. The interference lithography apparatus according to claim 8, wherein, an included angle of 45° is formed between the center axis direction of the reflecting unit and the incident direction of the collimated UV laser beam emitted from the collimating unit.

10. The interference lithography apparatus according to claim 5, wherein, the interference lithography apparatus further comprises a lithography platform for placing the substrate coated with the photoresist; the lithography platform is capable of rotating so as to adjust the prism direction of the prism film; and the lithography platform is capable of moving with respect to the light converging unit so as to adjust sizes of the interference light spots.

11. The interference lithography apparatus according to claim 5, wherein, the light converging unit comprises a first reflecting subunit, a second reflecting subunit, a first beam expanding subunit and a second beam expanding subunit;
- wherein, the light splitting unit reflects one half of the collimated UV laser beam to the first reflecting subunit, and transmitting the other half of the collimated UV laser beam to the second reflecting subunit;
- the first reflecting subunit is used for reflecting the incident collimated UV laser beam to the first beam expanding subunit;
- the second reflecting subunit is used for reflecting the incident collimated UV laser beam to the second beam expanding subunit;
- the first and second beam expanding subunits are used for expanding the incident collimated UV laser beam, and then converging the expanded UV laser beams on the surface of the substrate coated with the photoresist at an interference angle ($\theta$) for the interference lithography.

12. The interference lithography apparatus according to claim 11, wherein, the first and second reflecting subunits are reflectors, the first and second reflecting subunits are arranged symmetrically by taking a reflecting surface of the light splitting unit as an symmetrical plane.

13. The interference lithography apparatus according to claim 11, wherein, the first and second beam expanding subunits are beam expanding convex lenses, the positions of the first and second beam expanding subunits are determined by focal lengths thereof and sizes of the interference light spots formed on the surface of the substrate coated with the photoresist.

14. The interference lithography apparatus according to claim 12, wherein, the first and second reflecting subunits move with respect to the reflecting surface of the light splitting unit, so as to adjust the sizes of interference light spots.

15. The interference lithography apparatus of claim 12, wherein, the first and second reflecting subunits rotate with respect of the reflecting surface of the light splitting unit, so as to adjust the interference angle.

16. The interference lithography apparatus of claim 13, wherein, the first beam expanding subunit and the second beam expanding subunit move with respect to the first reflecting subunit and the second reflecting subunit respectively, so as to adjust the sizes of the interference light spots.

17. The interference lithography apparatus of claim 13, wherein, the first beam expanding subunit and the second beam expanding subunit rotate with respect to the first reflecting subunit and the second reflecting subunit respectively, so as to adjust the interference angle ($\theta$).

* * * * *